(12) United States Patent
Puygranier et al.

(10) Patent No.: US 10,900,996 B2
(45) Date of Patent: Jan. 26, 2021

(54) MICROMECHANICAL SENSOR AND METHOD FOR MANUFACTURING A MICROMECHANICAL SENSOR

(71) Applicant: Robert Bosch GmbH, Stuttgart (DE)

(72) Inventors: Antoine Puygranier, Asperg (DE); Denis Gugel, Dusslingen (DE); Guenther-Nino-Carlo Ullrich, Reutlingen (DE); Johannes Classen, Reutlingen (DE); Markus Linck-Lescanne, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 74 days.

(21) Appl. No.: 16/090,845

(22) PCT Filed: May 4, 2017

(86) PCT No.: PCT/EP2017/060604
§ 371 (c)(1),
(2) Date: Oct. 3, 2018

(87) PCT Pub. No.: WO2017/194376
PCT Pub. Date: Nov. 16, 2017

(65) Prior Publication Data
US 2019/0107553 A1    Apr. 11, 2019

(30) Foreign Application Priority Data
May 9, 2016   (DE) .................. 10 2016 207 866

(51) Int. Cl.
*G01P 15/18*   (2013.01)
*G01P 15/125*   (2006.01)
(Continued)

(52) U.S. Cl.
CPC ............ *G01P 15/18* (2013.01); *B81B 3/0021* (2013.01); *G01P 15/125* (2013.01); *B81B 2201/0235* (2013.01); *G01P 2015/0834* (2013.01)

(58) Field of Classification Search
CPC .......... B81B 3/0021; B81B 2201/0235; G01P 2015/0834; G01P 15/18; G01P 15/125
See application file for complete search history.

(56) References Cited

U.S. PATENT DOCUMENTS

| 2009/0280594 A1 | 11/2009 | Mehregany |
| 2013/0104654 A1* | 5/2013 | Classen .................. G01P 15/18 73/514.16 |

FOREIGN PATENT DOCUMENTS

| CN | 101981457 A | 2/2011 |
| CN | 102449488 A | 5/2012 |

(Continued)

OTHER PUBLICATIONS

International Search Report for PCT/EP2017/060604, dated Jul. 11, 2017.

*Primary Examiner* — Nathaniel T Woodward
(74) *Attorney, Agent, or Firm* — Norton Rose Fulbright US LLP; Gerard Messina

(57) ABSTRACT

A micromechanical sensor, including: a substrate; a movable mass element sensitive in three spatial directions; two x-lateral electrodes for detecting a lateral x-deflection of the movable mass element; two y-lateral electrodes for detecting a lateral y-deflection of the movable mass element; z-electrodes for detecting a z-deflection of the movable mass element; each lateral electrode being fastened on the substrate with the aid of a fastening element; the fastening elements of all electrodes being formed close to a connection element of the movable mass element to the substrate.

8 Claims, 12 Drawing Sheets

(51) Int. Cl.
*B81B 3/00* (2006.01)
*G01P 15/08* (2006.01)

(56) References Cited

FOREIGN PATENT DOCUMENTS

| | | |
|---|---|---|
| CN | 102955046 A | 3/2013 |
| DE | 102008001442 A1 | 11/2009 |
| DE | 102012200740 A1 | 5/2013 |
| EP | 2390671 A2 | 11/2011 |
| WO | 2011016859 A2 | 2/2011 |

\* cited by examiner

MICROMECHANICAL SENSOR AND METHOD FOR MANUFACTURING A MICROMECHANICAL SENSOR

FIELD OF THE INVENTION

The present invention relates to a micromechanical sensor. The present invention further relates to a method for manufacturing a micromechanical sensor.

BACKGROUND INFORMATION

Acceleration sensors are usually each designed as separate cores for three Cartesian detection directions x, y and z. The x-channel and the y-channel in this case are typically mass-spring structures, which experience a linear movement in-plane due to an acceleration in-plane. z-channel acceleration sensors are typically spring-mass structures, which experience a rotatory movement about a rotation axis defined by torsion springs due to an acceleration directed out-of-plane. An alternative for saving chip surface area is the implementation of a core, which is able to detect all three acceleration directions with one single seismic mass.

Such structures, often referred to as single mass oscillators, are known, for example, from German Published Patent Application No. 10 2008 001 442 as well as from German Published Patent Application No. 10 2012 200 740. In these publications, a single mass oscillator is provided with merely two spring elements, which are subject to bending or rotation in particular directions or about particular axes depending on the direction of the acceleration vector. Thus, with a suitable electrode configuration, a detection of all three acceleration directions becomes possible with one single movable mass. The structures shown are relatively sensitive to mechanical or thermomechanical stress, since suspension points of the electrodes experience a somewhat different shift when the substrate expands or bends, than a suspension point of the mass. This may result in false signals, in particular, in undesirable offset signals.

In German Published Patent Application No. 10 2012 200 740, a preferably central suspension of the fixed electrodes is highlighted as advantageous, since this may reduce an influence of substrate deformations, which may arise, for example, during circuit board assembly. The described sensors exhibit an only insufficient offset performance during the circuit board assembly or also after the assembly at changes of temperature. The problem of non-differential electrode cells is solved in that fixed electrodes, self-supporting above a second exposable micromechanical functional layer, may be implemented with a fully differential configuration.

In this configuration, the second micromechanical functional layer is situated below the first micromechanical functional layer and is typically, but not necessarily, thinner than the first micromechanical functional layer. The far-reaching carrier arms for the x-detection and y-detection, as well as the configuration of the x-electrode anchorings and y-electrode anchorings, which are not in line with the suspension of the mass, cause this configuration as well to remain sensitive to particular substrate deformations and to materially intrinsic changes in the thermomechanical properties of the two micromechanical layers. For example, the lower micromechanical layer may expand slightly differently over temperature than the upper micromechanical layer due to different manufacturing conditions (for example, different doping, different crystal structure, etc.). With changes in temperature this may result in undesirable relative shifts between fixed and movable electrode fingers and, thus, in offset signals.

SUMMARY

It is therefore an object of the present invention to provide a micromechanical sensor that is an improvement over the aforementioned concepts.

The object is achieved according to a first aspect by a micromechanical sensor, including:
a substrate;
a movable mass element sensitive in three spatial directions;
two x-lateral electrodes for detecting a lateral x-deflection of the movable mass element;
two y-lateral electrodes for detecting a lateral y-deflection of the movable mass element;
z-electrodes for detecting a z-deflection of the movable mass element;
each lateral electrode being fastened to the substrate with the aid of a fastening element;
the fastening elements of all electrodes being formed close to a connection element of the movable mass element to the substrate.

The micromechanical sensor is advantageously less sensitive to deformations of the substrate due to this specific design of the detection elements. Thus, a sensing characteristic or an offset performance of the micromechanical sensor is advantageously improved.

According to a second aspect, the object is achieved by a method for manufacturing a micromechanical sensor, including the steps:
providing a substrate;
providing a movable mass element sensitive in three spatial directions;
forming two x-lateral electrodes;
forming two y-lateral electrodes;
forming two z-electrodes; and
fastening all electrodes to the substrate close to a connection element of the movable mass element.

One advantageous refinement of the micromechanical sensor is distinguished by the fact that electrode backings of the lateral electrodes are short in relation to a longitudinal dimension of the sensor. Thus, carrier arms of the detection fingers of the lateral electrodes are short, thereby promoting as a result an insensitivity of the entire sensor with respect to substrate deformations.

Another advantageous refinement of the micromechanical sensor provides that lengths of the electrode backings are approximately one third of a half of a longitudinal dimension of the sensor. In this way, a favorable size proportion for the electrode backings in relation to the overall dimensions of the sensor is implemented.

Another advantageous refinement of the micromechanical sensor is characterized in that conduction elements for the electrodes are formed in a first and a second functional layer of the sensor. In this way, manufacturing of the micromechanical sensor may be carried out according to proven principles of surface micromechanics.

Another advantageous refinement of the micromechanical sensor is characterized in that detection fingers and electrode backings of the lateral electrodes are formed in a third functional layer of the sensor. This also promotes a simple manufacturability of the sensor using proven surface micromechanical processes.

The present invention is described in detail below, including additional features and advantages with reference to multiple figures. All described features form the subject matter of the present invention, regardless of their representation in the description and in the figures. Identical or functionally identical elements have the same reference numerals. The figures are intended, in particular, to clarify the principles essential to the present invention and are not necessarily true to scale.

Described method features result similarly from corresponding described device features and vice versa. This means, in particular, that features, technical advantages and embodiments relating to the micromechanical sensor result analogously from corresponding embodiments, features and advantages relating to the method for manufacturing a micromechanical sensor and vice versa.

DETAILED DESCRIPTION

A basic concept of the present invention is to design and situate suspension structures and fastening structures for all electrodes of a micromechanical acceleration sensor preferably close to the center. In this way, substrate deformations are incorporated as little as possible in a sensing characteristic of the sensor, as a result of which an offset performance of the sensor may be significantly improved. All electrodes of the sensor are designed according to the fully differential principle known per se, in which capacitance changes due to the displaced movable mass may be detected and evaluated.

A combination of a suitable spring-mass structure, which is sensitive to accelerations in all three spatial directions, and a specific fully differential configuration of the electrodes for x-detection, y-detection as well as z-detection, is described. In this case, at least two suspensions are provided for each polarity for the suspension and configuration of the lateral fixed electrodes both for the x-axis as well as for the y-axis. This allows for better symmetry conditions to be created between electrode suspension and mass suspension and for particular substrate deformations to be better compensated for. In addition, the carrier arms and the electron backings of the fixed electrodes are short in relation to a total length, so that any deformations occurring in the anchoring area or in the micromechanical layers themselves impact a change in the distances between movable and fixed electrodes to a significantly lesser degree than in the related art. This results overall in a significantly improved offset performance of the acceleration sensor.

Figure 1:
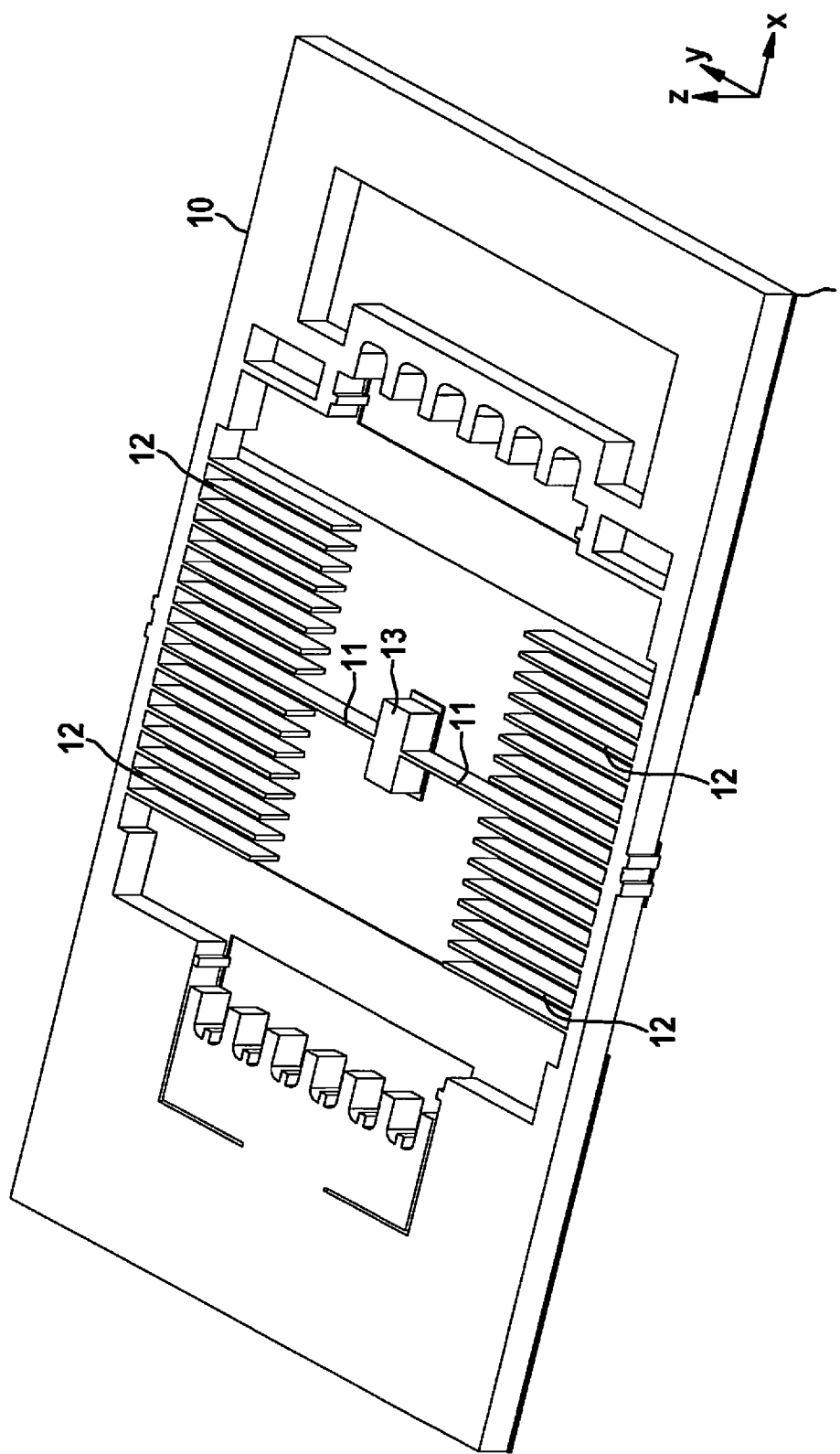
FIG. 1 shows a movable mass element of a conventional micromechanical z-acceleration sensor.

FIG. 1 shows a perspective view of a movable seismic mass element 10 in the form of a rocker, which is fastened to or connected on a substrate 1 with the aid of a central connection element 13. A seismic mass of the left rocker arm is larger than a mass of the right rocker arm and as a result implements a mass asymmetry of the movable mass element 10. A spring 11, which is oriented in the y-direction, is situated on connection element 13. Situated outside on spring 11 is mass element 10 in the form of a frame with an asymmetrically distributed mass. Detection fingers 12 for the detection of lateral acceleration in x-direction and y-direction are situated on both sides next to spring 11. A micromechanical functional layer (not depicted) situated below is used for a detection of the out-of-plane channel z.

Figure 2:
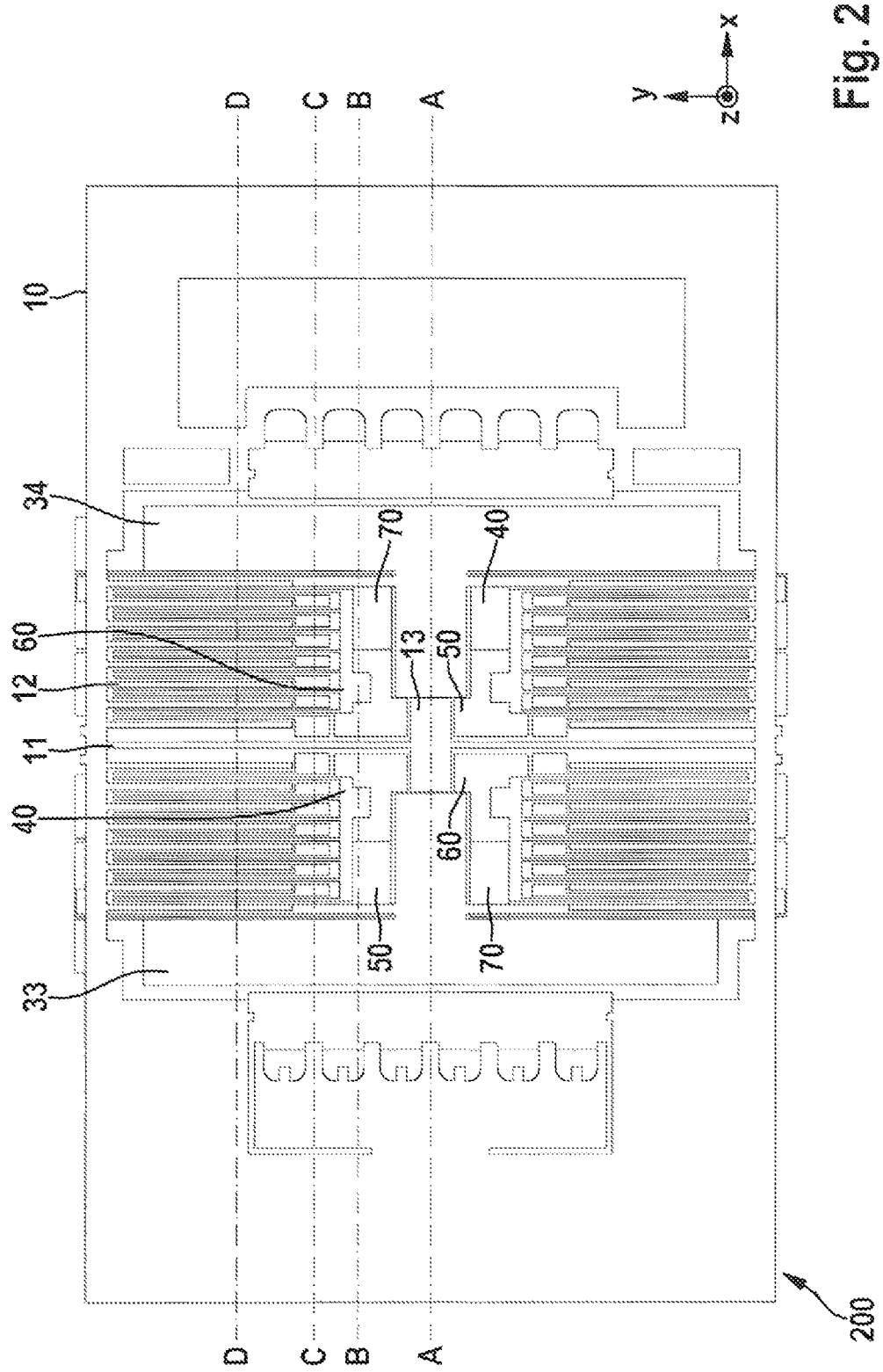
FIG. 2 shows a top view of one specific embodiment of a micromechanical sensor according to the present invention.

FIG. 2 shows a top view of one specific embodiment of micromechanical sensor 200 according to the present invention. Four section lines A-A, B-B, C-C and D-D are apparent, which are explained in greater detail in additional figures. It is apparent that x-electrode fastening elements 40, 50 and y-electrode fastening elements 60, 70 are situated on the central connection element 13 for movable mass element 10. Thus, for lateral x-electrodes and for lateral y-electrodes ("in-plane electrodes"), two fastening elements 40, 50 each, separated from one another, are situated on central connection element 13 for movable mass element 10. In addition, the two z-electrodes 33, 34 ("out-of-plane electrodes") are also situated close to central connection element 13. As a result, all electrodes are thus centrally connected close to connection element 13 with substrate 1, whereby a compact design of micromechanical sensor 200 is advantageously implemented.

Figure 3:
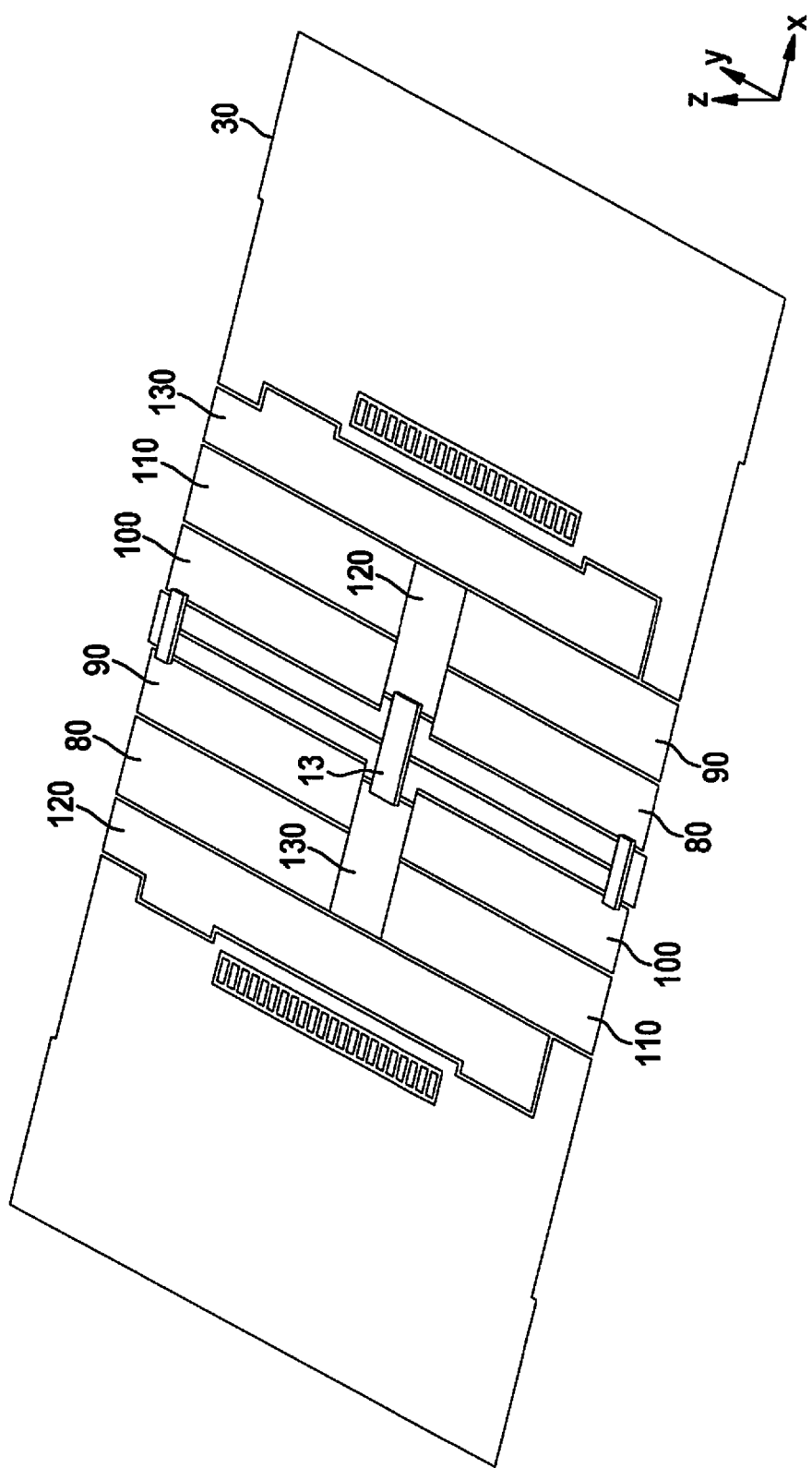
FIG. 3 shows a top view of a lower-most layer of one specific embodiment of the micromechanical sensor according to the present invention.

FIG. 3 shows leads of conduction elements 80 . . . 130 for implementing electrical connections of the aforementioned electrodes. All aforementioned conduction elements 80 . . . 130 are formed in a first or lower-most micromechanical functional layer (formed preferably of polysilicon) of micromechanical sensor 200. Conduction elements 80, 90 and 100, 110 for the lateral x-electrodes and for the lateral y-electrodes in this case are each formed in duplicate.

Conduction elements 80, 90 exhibit suitable electrical potentials, so that a movement of detection fingers 12 between lateral x-electrode fingers is detectable. Conduction elements 100, 110 exhibit suitable electrical potentials, so that a movement of detection fingers 12 between lateral y-electrode fingers is detectable. Conduction elements 120, 130 exhibit suitable electrical potentials for detecting a deflection of seismic mass element 10 in the z-direction.

Figure 4:
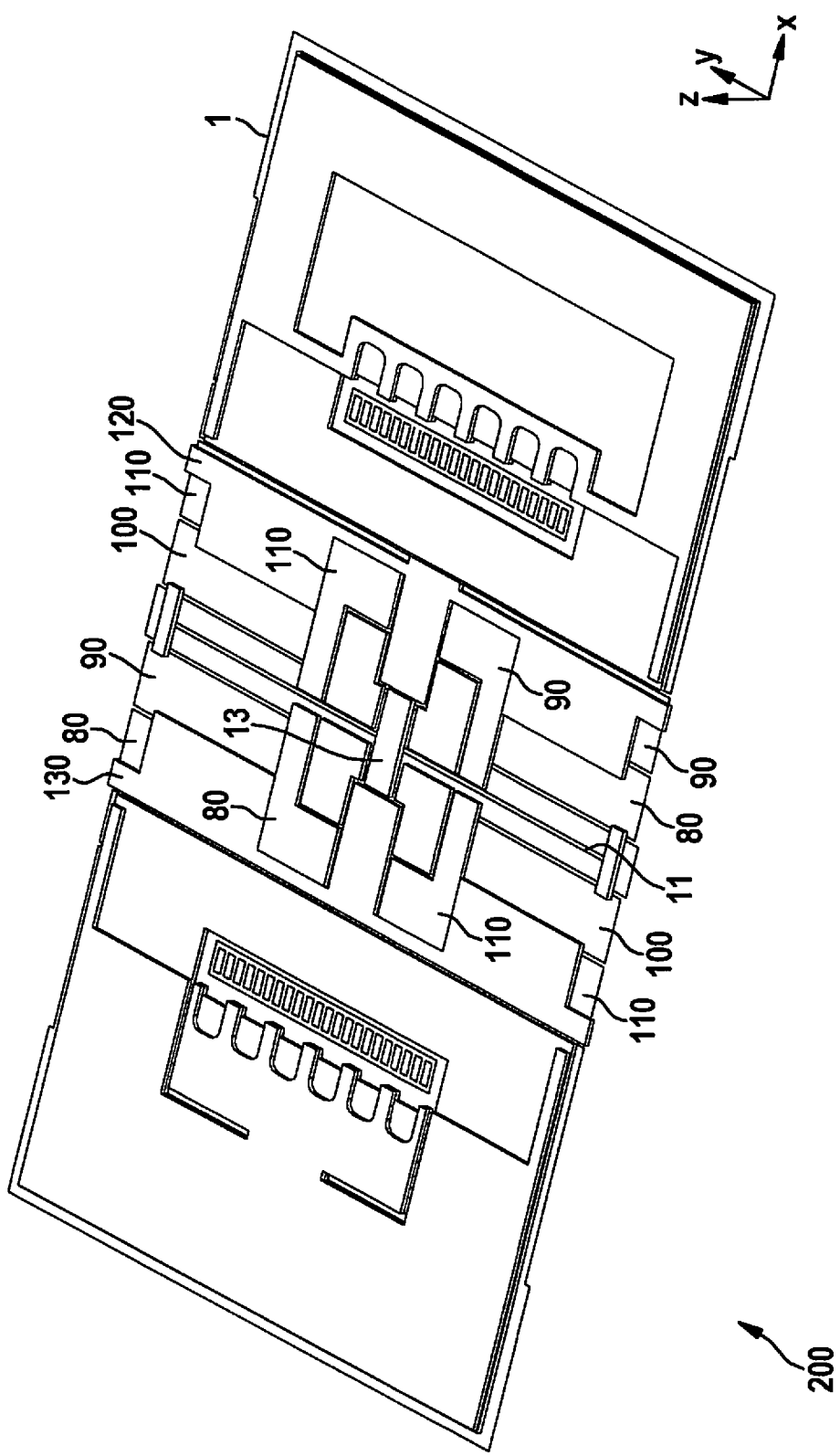
FIG. 4 shows a top view of one specific embodiment of the micromechanical sensor according to the present invention, which includes an additional functional layer.

FIG. 4 shows the structure of micromechanical sensor 200, which includes an additional micromechanical functional layer in the area of conduction elements 80, 90, 100, 110, 120, 130. It is apparent that conduction elements 80, 90, 110 have an L-shaped design close to central connection element 13, so that an electrical connection of the lateral x-electrodes and lateral y-electrodes is thus implemented. The aforementioned L-shaped elements are formed in a second micromechanical functional layer (formed preferably of polysilicon) of micromechanical sensor 200, which is situated on the lower-most functional layer.

Figure 5:
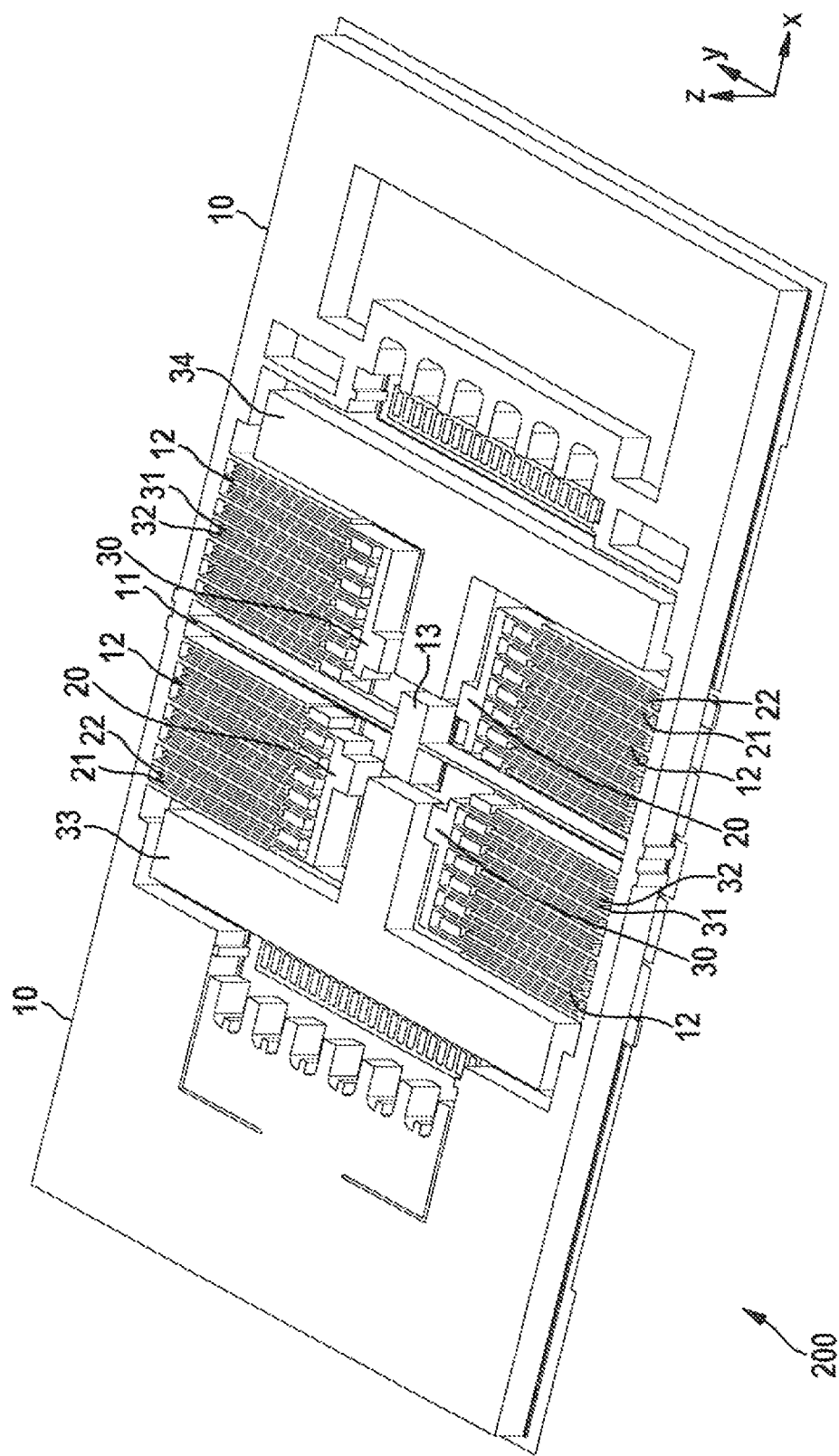
FIG. 5 shows a perspective view of one specific embodiment of the micromechanical sensor according to the present invention.

FIG. 5 shows a perspective illustration of one specific embodiment of the described micromechanical sensor 200, including all micromechanical functional layers. For the detection of an acceleration in the x-direction, x-electrode fingers 21, 22 are apparent, which interact with one movable detection finger 12 each of mass element 10. It is apparent that two such structures are situated diagonally offset from one another with respect to central connection element 13. Also provided for the detection of the lateral y-deflection are y-electrode fingers 31, 32, which each interact with one moveable detection finger 12 of mass element 10. Lateral electrodes 20, 21, 22 and 30, 31, 32 are situated diagonally offset from one another with respect to central connection element 13.

Two x-electrode backings 20 are apparent, on which x-electrode fingers 21, 22 are situated, one detection finger 12 of movable mass element 10 being situated between two x-electrode fingers 21, 22, respectively. Two y-electrode backings 30, on which y-electrode fingers 31, 32 are formed, are provided for a detection of a deflection of movable mass element 10 in the y-direction, two y-electrode fingers 31, 32 each interacting with one movable detection finger 12, respectively. The y-electrode structure may be suitably acted upon in terms of potential with the aid of conduction elements 100, 110, as may the x-electrode structure with the aid of conduction elements 80, 90. In such case, electrode backings 20, 30 may exhibit identical or different electrical potentials, depending on the specific application.

One dimension of electrode backings 20, 30 is approximately one third of the half length of micromechanical sensor 200. The two z-electrodes 33, 34 each are situated between two lateral electrodes, so that a compact detection structure for micromechanical sensor 200 is thus implemented.

Figure 6:
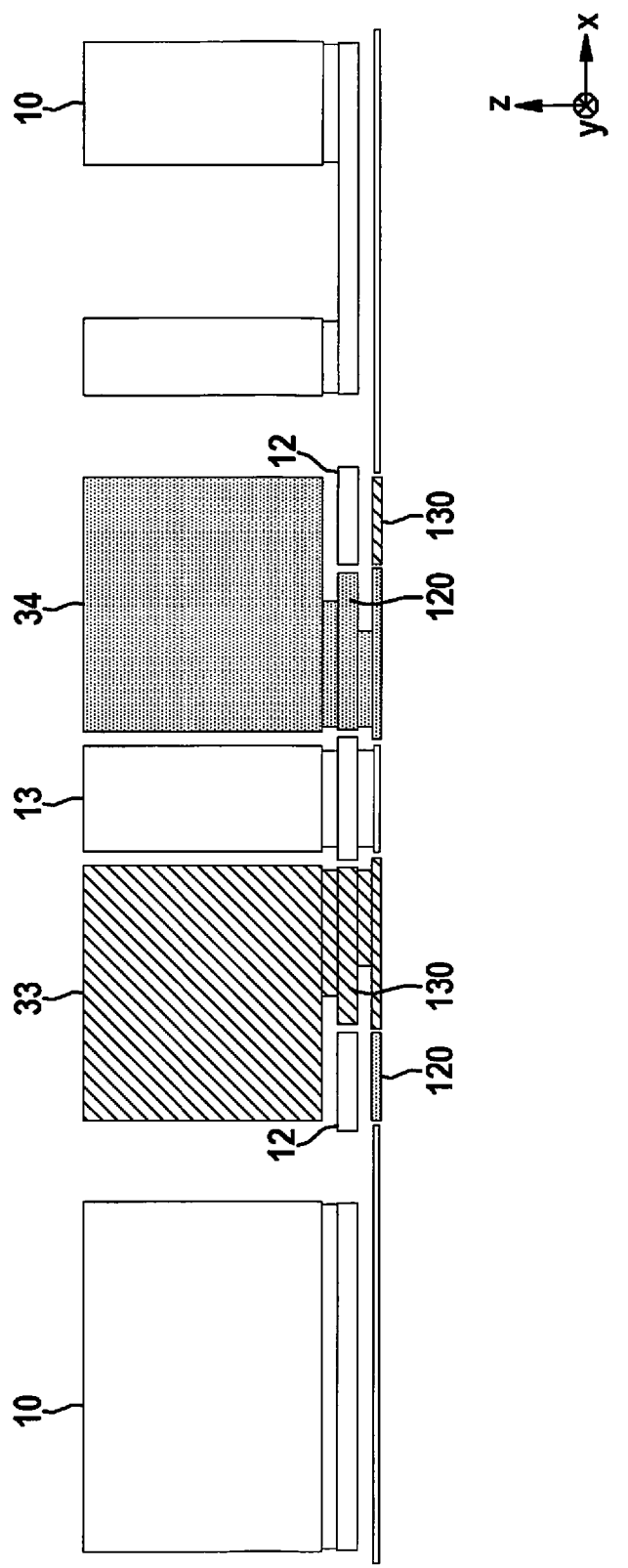
FIG. 6 shows a sectional view along a section line A-A of FIG. 2.

FIG. 6 is a depiction of a sectional view through described micromechanical sensor 200 of FIG. 2 along section line A-A. It is apparent that z-electrodes 33, 34 are connected with conduction elements 130, 120 to the lower-most micromechanical functional layer of sensor 200. Also apparent here is the fully differential design of z-electrodes 33, 34, a conduction element 120 having the electrical potential of z-electrode 34 being formed below z-electrode 33. One detection finger 12 each of movable mass element 10 is situated between z-electrodes 33, 34 and conduction elements 120, 130.

Figure 7:
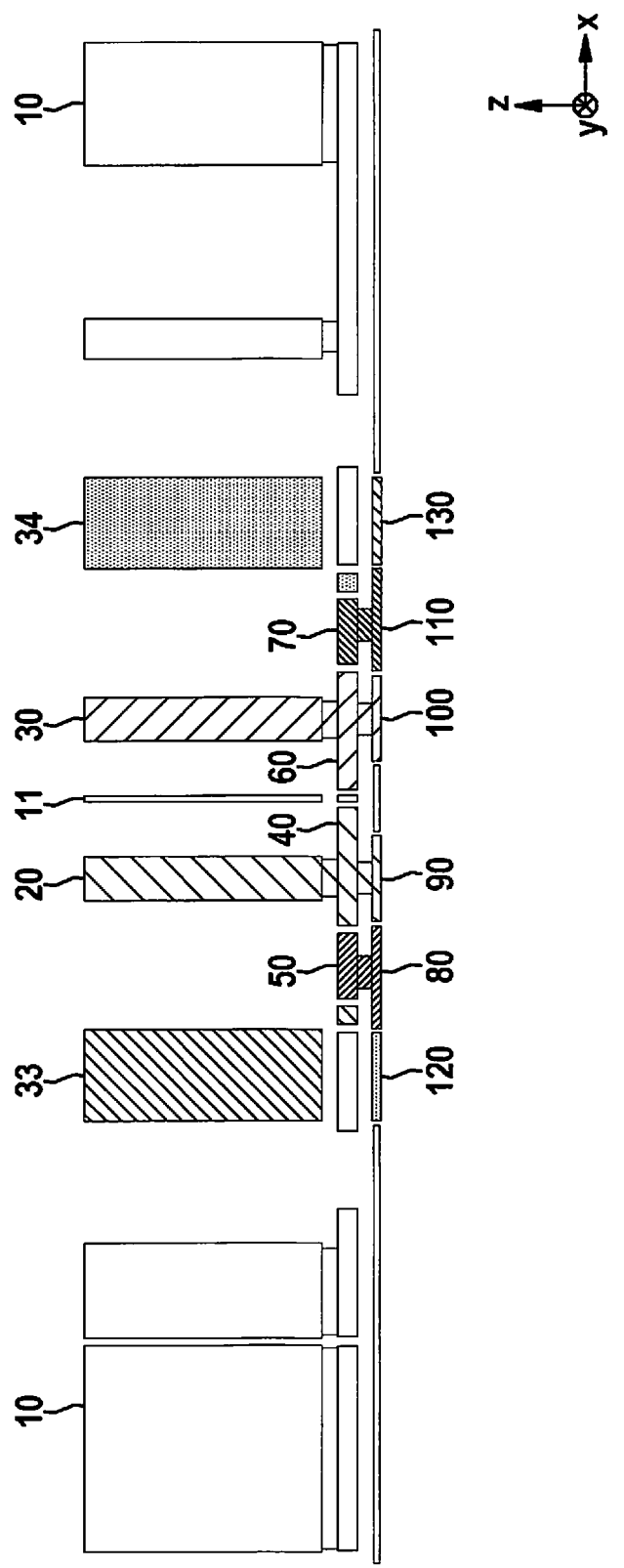
FIG. 7 shows a sectional view along a section line B-B of FIG. 2.

FIG. 7 shows a sectional view through described sensor 200 of FIG. 2 along section line B-B. Conduction elements 80, 90, 100, 110 are apparent for electrically connecting the lateral x-electrodes and lateral y-electrodes in the lower-most functional layer. It is further apparent that z-electrodes 33, 34, as well as lateral electrode backings 20, 30, are situated together with L-shaped fastening elements 40, 50, 60 and 70 close to central connection element 13 and spring 11.

Figure 8:
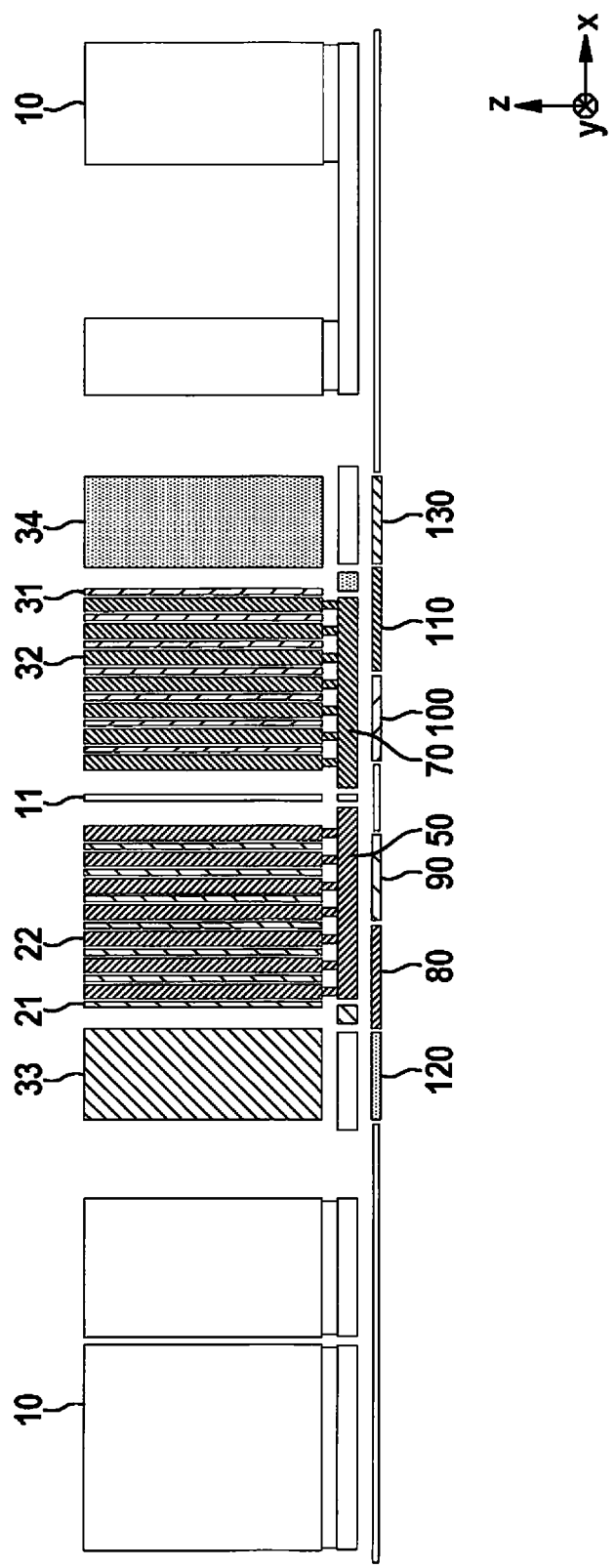
FIG. 8 shows a sectional view along a section line C-C of FIG. 2.

FIG. 8 shows a sectional view through the described structure of FIG. 2 along section line C-C. x-electrode fingers 21, 22 of the lateral x-electrode and y-electrode fingers 31, 32 of the lateral y-electrode are apparent, each of which are situated on an L-shaped fastening element 50 and 70, which are formed in the second functional layer.

Figure 9:
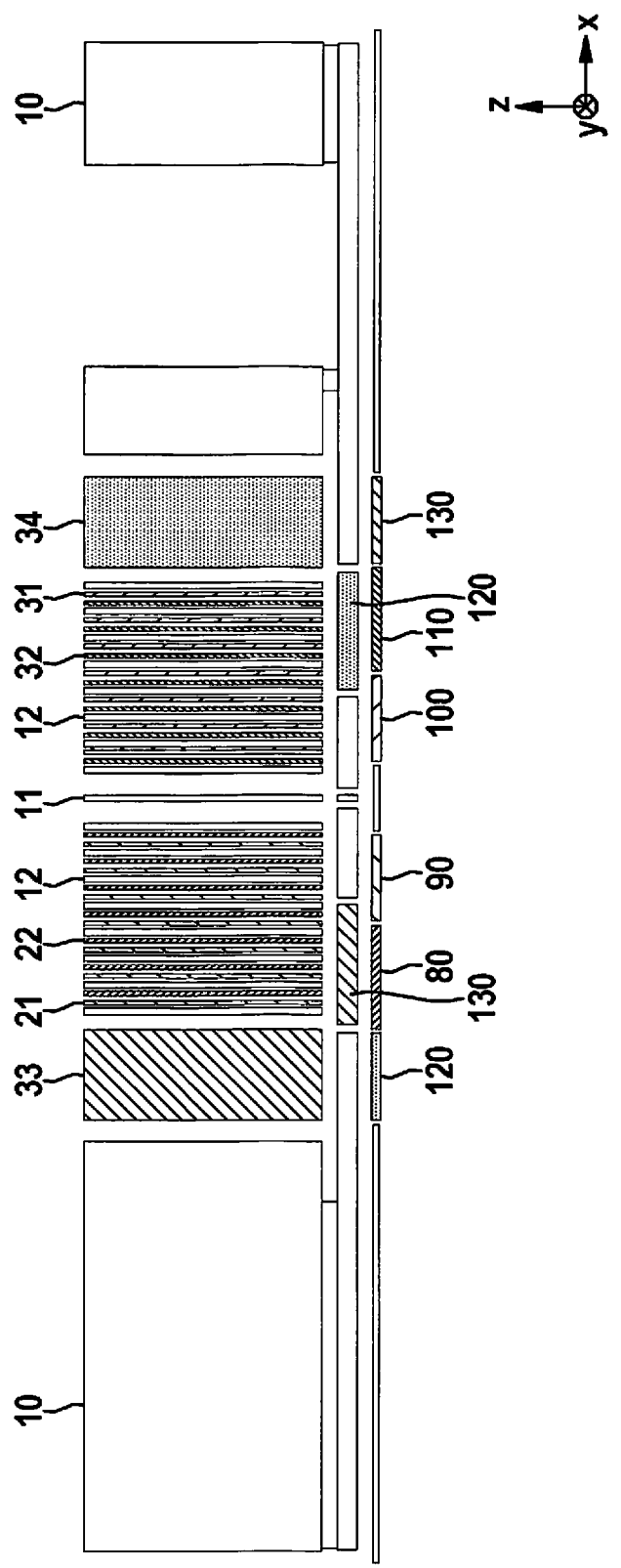
FIG. 9 shows a sectional view along a section line D-D of FIG. 2.

A sectional view of micromechanical sensor 200 along section line D-D is depicted in FIG. 9. Apparent, in addition to the elements of FIG. 8, are the detection fingers 12 of movable mass element 10. Also apparent here are conduction elements 120, 130 in the second micromechanical functional layer of sensor 200, conduction element 130 being provided for electrically connecting z-electrode 33 and conduction element 120 for electrically connecting z-electrode 34.

Figure 10:
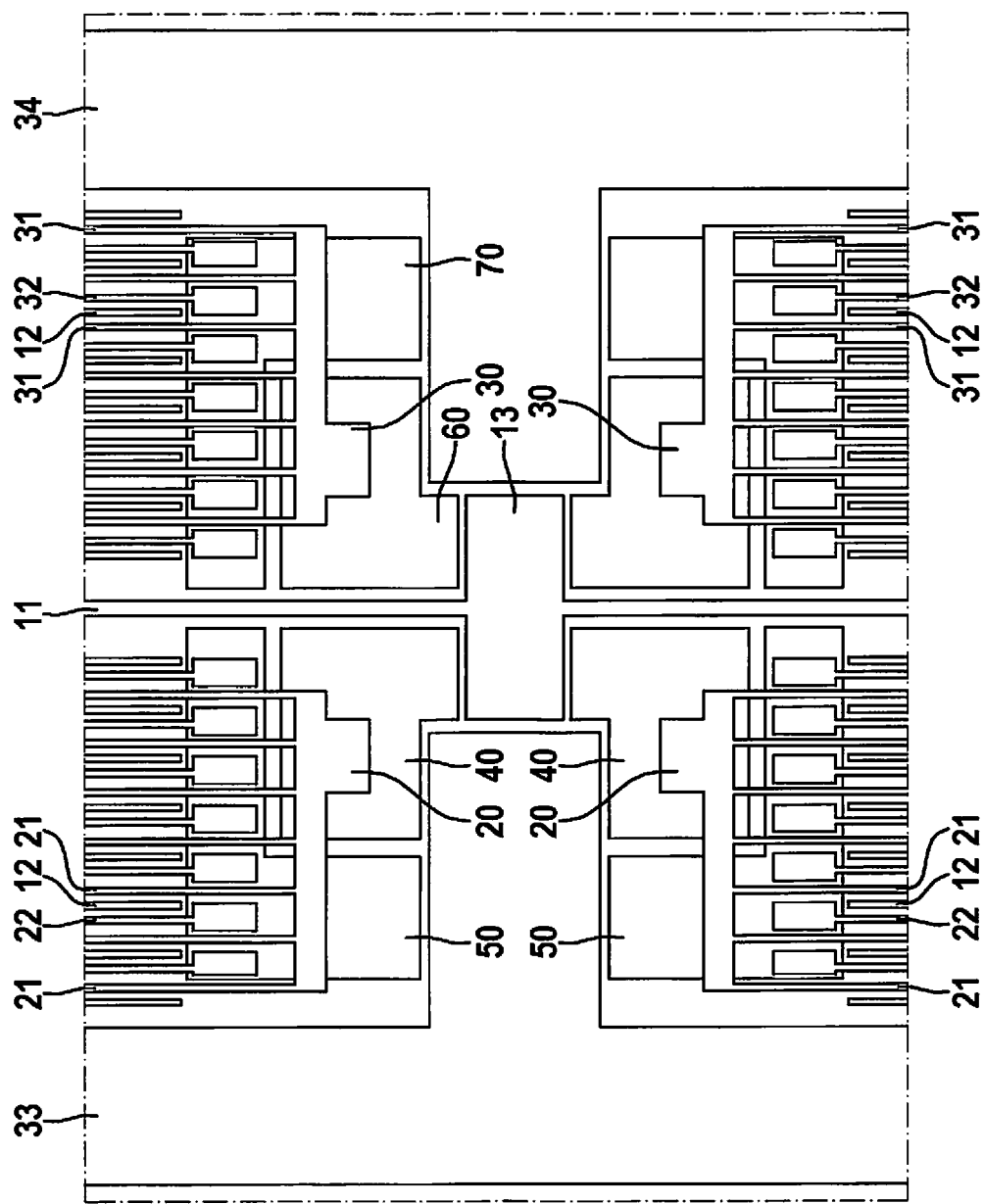
FIG. 10 shows a top view of an alternative specific embodiment of the micromechanical sensor.

FIG. 10 shows a top view of a first alternative of described micromechanical sensor 200. In this case, x-electrode backings 20, as well as y-electrode backings 30, are situated not diagonally, but opposite one another with respect to central connection element 13. Structurally, there is no difference compared to the configurations of FIGS. 5 through 9; here, however, one of electrode backings 30 exhibits the electrical potential of conduction element 100 and the other electrode backing 30 exhibits the electrical potential of conduction element 110. The two electrode backings 20 both exhibit the same electrical potential of conduction element 90.

Figure 11:
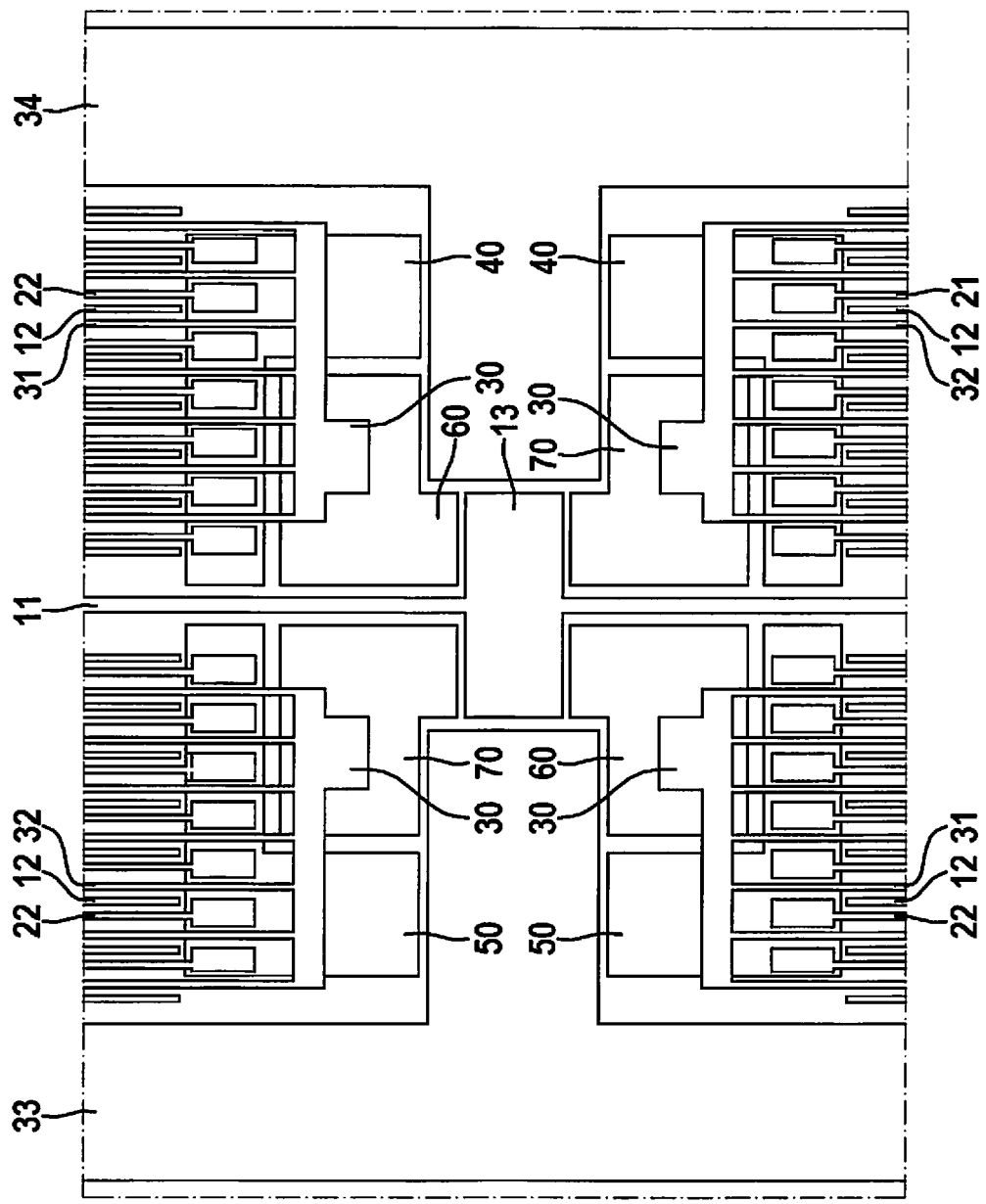
FIG. 11 shows a top view of an additional, alternative specific embodiment of the micromechanical sensor.

FIG. 11 shows a top view of a second alternative of micromechanical sensor 200 according to the present invention. In this case, the two L-shaped fastening elements 50 of the lateral x-electrodes are acted upon with the electrical potential of conduction elements 80 and the two L-shaped fastening elements 40 of the lateral x-electrodes are acted upon with the electrical potential of conduction elements 90. Fastening elements 60 of both lateral y-electrodes are acted upon with the electrical potential of conduction elements 100 and fastening elements 70 of both lateral y-electrodes are acted upon with the electrical potential of conduction elements 110.

It is apparent from the variants of FIGS. 10 and 11 that an application of suitable electrical potentials of conduction elements 80 through 110 to electrode backings 20, 30 may be advantageously implemented in a simple manner.

Which of the electrode configurations depicted in the FIGS. 5, 10, 11 has a particularly high insensitivity to substrate deformations depends ultimately on the type of substrate deformation, which may be different for various mounting positions of the sensor core in the chip and for various housing variants. Thus, the respectively optimal electrode configuration for a specific product may be selected as a function of the boundary conditions of the housing.

Figure 12:
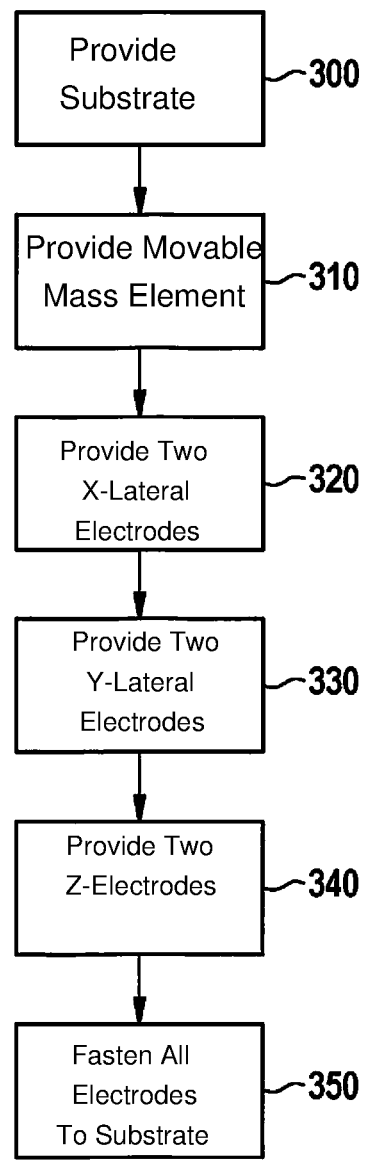
FIG. 12 shows a basic sequence of a method for manufacturing a micromechanical sensor according to the present invention.

FIG. 12 shows a basic sequence of the described method:

A substrate 1 is provided in a step 300.

A movable mass element 10, sensitive and movable in three spatial directions x, y, z is provided in a step 310.

Two x-lateral electrodes 20, 21, 22 are formed in a step 320.

Two y-lateral electrodes 30, 31, 32 are formed in a step 330.

Two z-electrodes are formed in a step 340.

All electrodes 20, 21, 22, 30, 31, 32, 33, 34 are fastened to substrate 1 close to a connection element 13 of movable mass element 10 in a step 350.

The order of the steps here may also be changed.

In summary, a micromechanical sensor manufacturable with the aid of a surface micromechanical method is provided with the present invention, which advantageously implements an optimized sensing behavior in that all detection-relevant elements are preferably situated close to a mass suspension. In this way, the substrate may warp in preferably the same manner as the moveable mass element. As a result, an insensitivity of the acceleration sensor to substrate deformations is thereby advantageously increased.

As a result, therefore, an acceleration sensor is provided as a single mass oscillator, for which the detection of x-accelerations, y-accelerations and z-accelerations is made possible in a single core and which exhibits at the same time an excellent robustness with respect to substrate deformations, i.e. a good offset performance during the circuit board assembly and under thermomechanical stress in the sensor housing.

Although the present invention has been described above with reference to specific application examples, those skilled in the art going forward may also implement undisclosed or only partially disclosed specific embodiments without departing from the core of the present invention.

What is claimed is:

1. A micromechanical sensor, comprising:
a substrate;
a movable mass element sensitive in three spatial directions;
two x-lateral electrodes for detecting deflection of the movable mass element due to acceleration in the x-direction;
two y-lateral electrodes for detecting deflection of the movable mass element due to acceleration in the y-direction; and
z-electrodes for detecting deflection of the movable mass element due to acceleration in the z-direction, wherein each of the electrodes is fastened on the substrate via fastening elements, and the fastening elements of all the electrodes are fastened on a central connection element of the movable mass element to the substrate;
wherein each of the two x-lateral electrodes and each of the two y-lateral electrodes includes two fastening elements,
wherein each of the two x-lateral electrodes and each of the two y-lateral electrodes includes a plurality of electrode fingers formed in a third functional layer,
wherein half of the plurality of x-electrode fingers and half of the plurality of y-electrode fingers are situated on top of the fastening elements formed in a second functional layer, and
wherein half of the plurality of x-electrode fingers and half of the plurality of y-electrode fingers are directly connected to each other in the third functional layer.

2. The micromechanical sensor as recited in claim 1, wherein lengths of electrode backings are one third of a half of a longitudinal dimension of the sensor.

3. The micromechanical sensor as recited in claim 1, further comprising:
conduction elements for the electrodes, the conduction elements being formed in a first functional layer and in the second functional layer of the sensor.

4. The micromechanical sensor as recited in claim 3, wherein detection fingers and electrode backings of the electrodes are formed in the third functional layer of the sensor.

5. A method for manufacturing a micromechanical sensor, the method comprising:
providing a substrate;
providing a movable mass element that is sensitive and movable in three spatial directions;
forming two x-lateral electrodes for detecting deflection of the movable mass element due to acceleration in the x-direction;
forming two y-lateral electrodes for detecting deflection of the movable mass element due to acceleration in the y-direction;
forming two z-electrodes for detecting deflection of the movable mass element due to acceleration in the z-direction; and
fastening all of the electrodes to the substrate on a central connection element of the movable mass element;
wherein each of the two x-lateral electrodes and each of the two y-lateral electrodes includes two fastening elements,
wherein each of the two x-lateral electrodes and each of the two y-lateral electrodes includes a plurality of electrode fingers formed in a third functional layer,
wherein half of the plurality of x-electrode fingers and half of the plurality of y-electrode fingers are situated on top of the fastening elements formed in a second functional layer, and
wherein half of the plurality of x-electrode fingers and half of the plurality of y-electrode fingers are directly connected to each other in the third functional layer.

6. The method as recited in claim 5, further comprising:
forming lengths of electrode backings of the electrodes a third as long as a half of a longitudinal dimension of the sensor.

7. The method as recited in claim 5, further comprising:
forming conduction elements for the electrodes in a first functional layer and in the second functional layer of the sensor.

8. The method as recited in claim 7, wherein the detection fingers and the electrode backings of the electrodes are formed in the third functional layer of the sensor.

* * * * *